United States Patent
Okuhama et al.

(10) Patent No.: US 7,056,448 B2
(45) Date of Patent: *Jun. 6, 2006

(54) METHOD FOR FORMING CIRCUIT PATTERN

(75) Inventors: Yoshiaki Okuhama, Akashi (JP); Keigo Obata, Akashi (JP); Masakazu Yoshimoto, Akashi (JP); Shingo Kitamura, Akashi (JP); Seiichiro Nakao, Akashi (JP); Osamu Masuyama, Kobe (JP); Hidenori Tsuji, Fujisawa (JP)

(73) Assignee: Daiwa Fine Chemicals Co., Ltd., Hyogo-ken (JP)

( * ) Notice: Subject to any disclaimer, the term of this patent is extended or adjusted under 35 U.S.C. 154(b) by 250 days.

This patent is subject to a terminal disclaimer.

(21) Appl. No.: 10/441,588

(22) Filed: May 20, 2003

(65) Prior Publication Data

US 2005/0258134 A1    Nov. 24, 2005

(30) Foreign Application Priority Data

May 20, 2002   (JP)   ............................ 2002-144411
Nov. 11, 2002  (JP)   ............................ 2002-326652

(51) Int. Cl.
*C23F 1/00*       (2006.01)
(52) U.S. Cl. ................... 216/105; 427/96.1; 427/304; 29/827; 29/847; 106/1.11; 106/1.12
(58) Field of Classification Search .............. 216/13, 216/105; 427/96.1, 304; 29/827, 847; 106/1.11, 106/1.12
See application file for complete search history.

(56) References Cited

U.S. PATENT DOCUMENTS 6,645,557 B1 * 11/2003 Joshi ........................ 427/304
6,743,319 B1 *  6/2004 Kydd ........................ 156/230
6,902,765 B1 *  6/2005 Brandes et al. ............ 427/305

FOREIGN PATENT DOCUMENTS

| | | |
|---|---|---|
| JP | 6069632 A | 3/1994 |
| JP | 6101054 A | 4/1994 |
| JP | 7011448 A | 1/1995 |
| JP | 8186351 A | 7/1996 |
| JP | 8283951 A | 10/1996 |
| JP | 8316612 A | 11/1996 |
| JP | 10190198 A | 7/1998 |
| JP | 10229280 A | 8/1998 |
| JP | 11135918 A | 5/1999 |
| JP | 2000-036652 A | 2/2000 |
| JP | 2000-036653 A | 2/2000 |
| JP | 2000-082878 A | 3/2000 |
| JP | 2000-178752 A | 6/2000 |
| JP | 2000-183522 A | 6/2000 |
| JP | 2000-236161 A | 8/2000 |
| JP | 2000-252622 A | 9/2000 |
| JP | 2001-339142 A | 12/2001 |

OTHER PUBLICATIONS

Clark, Handbook of Printed Circuit Manufacturing, 1985, Van Nostrand Reinhold Company, p. 5.*
Clark, Handbook of Printed Circuit Manufacturing, 1985, Van Nostrand Reinhold Company, pp. 4-5.*

* cited by examiner

*Primary Examiner*—Nadine G. Norton
*Assistant Examiner*—Eric B. Chen
(74) *Attorney, Agent, or Firm*—Akin Gump Strauss Hauer & Feld, LLP

(57) ABSTRACT

A method for forming a circuit pattern includes at least a step (a) of subjecting a non-conductor to electroless copper plating to form a copper film and a step (b) of etching the copper film so as to form a circuit pattern. As a catalyst for the electroless copper plating, a silver colloidal solution is used containing as essential components at least the following: (I) silver colloidal particles; (II) one or more of ions of metal having an electric potential which can reduce silver ions to metal silver in the solution and/or ions which result from oxidation of the ion at the time of reduction of the silver ions; and (III) one or more of hydroxycarboxylate, condensed phosphate and/or amine carboxylate ions. The silver colloidal particles (I) are produced by the ion (II) of the metal having an electric potential which can reduce silver ions to metal silver. The circuit pattern may be formed on a printed wiring board.

17 Claims, No Drawings

METHOD FOR FORMING CIRCUIT PATTERN

BACKGROUND OF THE INVENTION (i) Field of the Invention

The present invention relates to a technique of forming a circuit pattern. More specifically, the present invention relates to a technique of forming a circuit pattern to which an electroless plating technique is applied.

(ii) Description of the Related Art

A method for forming a conductive circuit by giving electroless copper plating on a non-conductor to form a film thereon, covering areas where the conductive circuit is to be formed with an etching resist film and then removing areas other than the covered areas by etching is a conventional method in formation of a circuit pattern that is widely used in productions of a printed circuit board, components of a chip and the like.

At this time, in the electroless copper plating, a tin-palladium based catalyst is generally used. Since the tin-palladium based catalyst has excellent catalysis, it is widely used as a general catalyst in electroless plating with nickel or the like in addition to the copper plating. However, it is known that the advantages of the tin palladium based catalyst, i.e., its strong adhesion to a non-conductor and strong catalytic activity, turn into defects in some cases.

That is, when an electroless copper film (or a subsequent copper electroplated film) is deposited by the tin-palladium based catalyst and the copper film is then etched to form a circuit pattern, there is a defect that the catalyst remains on surfacial areas of the non-conductive layer which has become exposed as a result of dissolution of the copper film, so that insufficient insulation and a short between the circuits or other defect are liable to occur in the conductive circuit. Further, to improve reliability of soldered connection, the whole or a portion of the surface of the conductive circuit may be subjecting to electroless nickel plating as upper layer plating and then to gold plating. In such a case, there is a serious defect that a nickel plated deposit spreads onto the non-conductive layer other than the conductive circuit where the catalyst remains (off-pattern deposition). The above defects are not necessarily specific to production of a printed circuit board using the latest technology. However, they have been becoming particularly evident in recent boards which have a circuit pattern with a narrow pitch or whose copper film layer is made thin by a build-up process.

To overcome such a defect as insufficient insulation caused by the residual palladium catalyst or the spread of the upper-layer electroless nickel plated deposit in areas other than the circuit which is related to the residual palladium catalyst, a variety of proposals have been disclosed.

Firstly, a first method is intended for dissolving and removing the nucleus of the palladium catalyst on the surface of the exposed non-conductive layer primarily by a chemical process. For example, in Japanese Patent Application Laid-Open No. 339142/2001, a catalyst remover for a printed wiring board which comprises at least one of nitric acid, a chlorine ion, a nitrogen-containing heterocyclic compound, a polyhydric alcohol, a nonionic or cationic surfactant, an iron ion, urea or a derivative thereof, and at least one guanidine is disclosed. Japanese Patent Application Laid-Open No. 178752/2000 discloses a method for producing a multilayer printed board by a build-up construction method using a subtractive method or a semiadditive method, wherein, after formation of a conductive circuit by etching, removal of a palladium catalyst is carried out by use of a palladium catalyst remover for electroless plating which comprises an aqueous solution containing a nitrogen-containing aliphatic organic compound and an iodine-containing inorganic compound. Further, Japanese Patent Application Laid-Open No. 183522/2000 discloses a method for producing a multilayer printed wiring board having excellent electrical insulation reliability by etching an external copper foil layer to form a conductive circuit and then washing the surface of an exposed resin composition layer with nitric acid. Further, Japanese Patent Application Laid-Open No. 69632/1994 discloses a method for producing a printed wiring board which comprises the steps of carrying out a treatment with a palladium-tin solution, removing tin partially and then carrying out electroless plating, wherein, to remove tin, hydrochloric acid of 1 to 10N is adjusted to 10 to 80° C., and an adhesive layer is then treated with the hydrochloric acid for 0.5 to 30 minutes.

A method classified as a second method is a method comprising deactivating the nucleus of the adsorbed palladium catalyst. For example, Japanese Patent Application Laid-Open No. 236161/2000 discloses a method comprising the steps of forming a circuit pattern, immersing a board in an alkyl benzimidazole solution to form a protective film of the alkyl benzimidazole against a sulfide compound around the circuit pattern, then immersing the board in a palladium deactivator composed essentially of a sulfide compound to deactivate palladium as a catalyst, and then immersing the board in hydrochloric acid to remove the alkyl benzimidazole forming the protective film for the circuit pattern. Further, Japanese Patent Application Laid-Open No. 36652/2000 discloses a method for producing a printed wiring board in which a palladium catalyst remaining on the surface of an insulating layer is deactivated by use of a mixed solution of aqueous ammonia and a sulfide compound. In addition, Japanese Patent Application Laid-Open No. 36653/2000 discloses a method for producing a printed wiring board in which after formation of a circuit board, a palladium catalyst remaining on the surface of an insulating layer is deactivated by use of a diluted hydrochloric acid solution and a thiosulfuric acid compound solution.

A method classified as a third method is a method with some devices made on steps such as etching of a copper film and removal of a resin film. For example, Japanese Patent Application Laid-Open No. 190198/1998 discloses a method for producing a printed wiring board which comprises the steps of applying a plating catalyst including palladium on an insulating layer of a board having the insulating layer on a surface, then forming a first plated film, etching the first plated film so as to form a conductive circuit and forming a second plated film on the conductive circuit so as to produce the printed wiring board, wherein, after the surface of the board having the conductive circuit formed thereon by etching the first plated film is covered with an insulating resin, the surfacial insulating resin layer is removed such that the conductive circuit is exposed and areas other than the conductive circuit remain covered with the insulating resin, and then the second plated film is formed on the exposed conductive circuit. The above publication also discloses a method comprising irradiating the surfacial insulating resin layer with a laser beam as a method of removing the surfacial insulating resin layer. Further, Japanese Patent Application Laid-Open No. 186351/1996 discloses an oxidation treatment of the surface of a circuit board after etching of a copper layer. Illustrative examples of the oxidation treatment include a permanganic acid treatment, a plasma treatment and an ozone treatment. The above publication discloses a method in which the surface of the board excluding a photoresist layer is removed and palladium remaining on the surface of the board is also removed by the oxidation treatment. Japanese Patent Application Laid-Open No. 135918/1999 discloses a method comprising removing a catalyst remaining on the surface of an insulating layer by irradiating a formed circuit pattern with a laser beam. Japanese Patent Application Laid-Open No. 252622/2000 discloses a method for producing a printed wiring board in which an electroless plated film and catalyst nuclei in areas other than a lower conductive circuit are removed while the lower conductive circuit is treated with an etching solution containing a cupric complex and an organic acid in the co-presence of oxygen so as to form a roughened surface.

A method classified as a fourth method is a method with some device made on a catalyst for electroless plating. Japanese Patent Application Laid-Open No. 101054/1994 discloses a copper-based-raw-material-selective catalyst solution for electroless plating which comprises an aqueous solution containing (I) at least one of a nickel compound and a cobalt compound and (II) at least one thiourea. Japanese Patent Application Laid-Open No. 11448/1995 discloses a copper-based-raw-material-selective catalyst solution for electroless plating which comprises an aqueous solution containing (i) 0.0001 to 0.5 moles/L of palladium compound and (ii) 0.1 to 10 moles/L of at least one compound selected from an alkali metal halide, an alkali metal sulfate, an alkaline earth metal halide, an alkaline earth metal sulfate, an ammonium halide and ammonium sulfate. Japanese Patent Application Laid-Open No. 316612/1996 discloses a method for producing a printed wiring board in which a complex comprising a noble metal ion and an amino complexing agent is used as a catalyst nucleus and the amount of the catalyst nucleus added is controlled so as to satisfy a conditional expression in terms of noble metal. Further, 2-aminopyridine is disclosed as the amino complexing agent, and it is also disclosed that an alkaline solution containing a palladium ion and 2-aminopyridine is suitable as a catalyst-nucleus-containing treatment solution. Further, Japanese Patent Application Laid-Open No. 283951/1996 discloses a method of depositing palladium having a particle diameter of 0.01 to 0.05 µm by vacuum deposition or sputtering and explains that since the same level of catalytic performance can be attained only by a small amount of deposition, the amount of palladium to be deposited can be small, so that the amount of the catalyst remaining after etching can be reduced. Further, use of a catalyst other than palladium has also been studied. Japanese Patent Application Laid-Open No. 229280/1998 discloses a method for producing a printed wiring board which uses, as a catalyst solution for providing a catalyst for electroless plating, an aqueous solution containing at least one metal salt selected from a silver salt and a copper salt, an anionic surfactant and a reducing agent. Further, Japanese Patent Application Laid-Open No. 82878/2000 discloses a method for producing a build-up multilayer printed wiring board which comprises the steps of adsorbing a metal hydroxide colloid to the roughed surface of an insulating layer and the roughed internal surfaces of blind via holes, reducing the colloid to produce an active metal and then giving electroless plating thereon. As the metal hydroxide colloid, a mixed hydroxide colloid of excess nickel hydroxide and copper hydroxide is suitably used.

Patent Document 1
Japanese Patent Application Laid-Open No. 339142/2001
Patent Document 2
Japanese Patent Application Laid-Open No. 178752/2000
Patent Document 3
Japanese Patent Application Laid-Open No. 183522/2000
Patent Document 4
Japanese Patent Application Laid-Open No. 69632/1994
Patent Document 5
Japanese Patent Application Laid-Open No. 236161/2000
Patent Document 6
Japanese Patent Application Laid-Open No. 36652/2000
Patent Document 7
Japanese Patent Application Laid-Open No. 36653/2000
Patent Document 8
Japanese Patent Application Laid-Open No. 190198/1998
Patent Document 9
Japanese Patent Application Laid-Open No. 186351/1996
Patent Document 10
Japanese Patent Application Laid-Open No. 135918/1999
Patent Document 11
Japanese Patent Application Laid-Open No. 252622/2000
Patent Document 12
Japanese Patent Application Laid-Open No. 101054/1994
Patent Document 13
Japanese Patent Application Laid-Open No. 11448/1995
Patent Document 14
Japanese Patent Application Laid-Open No. 316612/1996
Patent Document 15
Japanese Patent Application Laid-Open No. 283951/1996
Patent Document 16
Japanese Patent Application Laid-Open No. 229280/1998
Patent Document 17
Japanese Patent Application Laid-Open No. 82878/2000

SUMMARY OF THE INVENTION

The present inventors have determined that an object of the present invention is to solve the above defects such as insufficient insulation between circuits caused by the residue of a palladium catalyst for initiating electroless plating or the spread of upper-layer plated deposit in areas other than the circuit which is associated to the residual palladium catalyst.

The present inventors have found that by using a silver colloidal catalyst solution produced through reduction by a metal ion in place of palladium as a catalyst for initiating electroless plating, a circuit can be formed at a low cost without use of complicated steps. The present inventors have achieved the object of the present invention by this finding.

That is, the silver colloidal solution of the present invention which is produced through reduction by a metal ion is very stable and has catalytic activity which is equal to or higher than that of a tin palladium catalyst. Further, the silver colloidal catalyst can be removed easily by acid or a complexing agent solution as compared with the tin palladium catalyst and is an effective catalyst for electroless copper plating, while the silver colloidal catalyst has very low catalytic activity against electroless nickel, so that there is no possibility that nickel is deposited in areas other than the circuit when subjecting the circuit formed by etching copper to electroless nickel plating. The present inventors have found the above facts and achieved the object of the present invention.

That is, a subject of the present invention is a method for forming a circuit pattern comprising at least a step (a) of subjecting a non-conductor to electroless copper plating to form a copper film and a step (b) of etching the copper film so as to form a circuit pattern, which comprises using, as a catalyst for the electroless copper plating, a silver colloidal solution comprising, as essential components, at least the following (I), (II) and (III):

(I) silver colloidal particles, (II) one or more of ions of a metal having an electric potential which can reduce silver ions to metal silver in the solution or/and ions which result from oxidation of the ion at the time of reduction of the silver ions, and (III) one or more of hydroxycarboxylate, a condensed phosphate and/or amine carboxylate ions, the silver colloidal particles (I) being produced by the ion (II) of the metal having an electric potential which can reduce silver ions to metal silver.

Another subject of the present invention is the above method for forming a circuit pattern which further comprises a step (c) of subjecting the circuit pattern to electroless nickel plating.

Still another subject of the present invention is the above method for forming a circuit pattern in which the silver colloidal solution which further comprises (IV) one or more of ions selected from ions of metals whose atomic numbers are 26 to 30 is used.

According to the present invention, when the silver colloidal solution of the present invention formed by a metal ion is used as a catalyst for electroless copper plated deposit in the above circuit pattern formation method, circuit formation which is free from the spread of nickel in areas other than the circuit and insufficient insulation can be carried out by etching the plated copper film to form a circuit pattern and then subjecting the circuit pattern to electroless nickel plating without using the palladium catalyst solution containing tin ions.

In the above pattern formation method according to the present invention, the circuit pattern is one formed on a printed wiring board in particular.

In the above pattern formation method according to the present invention, the printed wiring board is a build-up printed wiring board in particular.

Still another subject of the present invention is a printed board prepared by use of the above circuit pattern formation method.

DETAILED DESCRIPTION OF THE PREFERRED EMBODIMENTS

The present invention is a method which is suitably used for forming a circuit pattern and comprises at least a step (a) of subjecting a non-conductor to electroless copper plating to form a copper film and a step (b) of etching the copper film so as to form the circuit pattern. Further, the method which is suitably used in formation of a circuit pattern further comprises a step (c) of subjecting the circuit pattern to electroless nickel plating. In this method, in order to act as a catalyst for the electroless copper plating, a silver colloidal solution comprising ions of a metal having an electric potential which can reduce silver ions to metal silver in the solution or ions which result from oxidation of the ion at the time of reduction of the silver ion is used in place of a conventional palladium-based catalyst. Since no palladium-based catalyst is used, the present invention does not lead to the defects that a palladium catalyst failed to be removed on etching of the electroless copper film remains and causes insufficient insulation and a short between the circuits or other ploblems in the conductive circuit, and that nickel plated deposit spreads onto the non-conductive layer (off-pattern deposition) when further subjecting to electroless nickel plating.

The silver colloidal solution used in the present invention is a solution in which silver is dispersed and suspended stably in the solution, substantially not as ions but as fine metal particles. In order for the particles to be suspended stably in such a colloidal solution, the particles are suitably those having a size of several nanometers to several tens of nanometers.

The silver colloidal solution used in the method of the present invention is a silver colloidal solution comprising, as essential components, at least the following (I), (II) and (III):

(I) silver colloidal particles, (II) one or more of ions of a metal having an electric potential which can reduce silver ions to metal silver in the solution or/and ions which result from oxidation of the ion at the time of reduction of the silver ions, and (III) one or more of hydroxycarboxylate, condensed phosphate and/or amine carboxylate ions, in addition to the silver colloidal particles, the silver colloidal particles (I) being produced by the ion ion (II) of the metal having an electric potential which can reduce silver ions to metal silver.

Further, the silver colloidal solution can also contain (IV) one or more of ions selected from ions of metals whose atomic numbers are 26 to 30.

As the ion (II) of the metal having an electric potential which can reduce silver ions to metal silver in the solution, tin, iron or/and titanium is/are suitably used. Of these, tin is most suitably used. Ions of these metals are used to produce a silver colloid by reducing silver ions. Tin and iron are used in the form of divalent ions, and titanium is used in the form of trivalent ions. After reducing the silver ions, some or all of the tin ions, iron ions and titanium ions turn into tetravalent ions, trivalent ions and tetravalent ions, respectively, and are contained in the silver colloidal solution in these forms.

As a source of the above ion (II) of the metal having an electric potential which can reduce silver ions to metal silver in the solution, an organic or inorganic tin, iron or titanium compound can be used. Any of salts of inorganic acids such as fluoroborates, sulfates, oxides, pyrophosphates, sulfamates or chlorides or salts or complexes of organic acids such as sulfonic acids or carboxylic acids are suitably used. Of these, the sulfates and sulfonates are more suitably used, and the sulfonates are particularly suitably used.

The hydroxycarboxylate ion is supplied from a carboxylic acid having a hydroxyl group and a salt thereof. As such a carboxylic acid and a salt thereof, glycolic acid, lactic acid, glyceric acid, tartronic acid, malic acid, tartaric acid, citric acid, gluconic acid and alkali metal salts thereof such as sodium and potassium salts are suitably used. Of these, tartaric acid, citric acid and gluconic acid are more suitably used.

The condensed phosphate ion is added in the form of condensed phosphoric acid and a salt thereof such as pyrophosphoric acid, sodium pyrophosphate and potassium pyrophosphate.

As the amine carboxylate ion, EDTA or/and NTA is/are suitably used.

In addition to the ions of the metal having an electric potential which can reduce silver ions to metal silver in the solution or/and the ions which result from oxidation of the metal ion at the time of reduction of the silver ion, the silver colloidal solution of the present invention may also contain, as additional components, ions selected from ions of metals whose atomic numbers are 26 to 30, in order to further improve stability and catalytic activity. Iron is suitably used when tin or titanium is used as the ion of the metal having an electric potential which can reduce silver ions to metal silver in the solution.

The ions selected from ions of metals whose atomic numbers are 26 to 30 are supplied from water-soluble compounds thereof, e.g., inorganic salts of these metals such as chlorides, sulfates and nitrates, salts or complexes with organic acids such as a sulfonic acid and a carboxylic acid, and metal complexes such as ammine complexes. Of these, the sulfates and sulfonates are more suitably used, and the sulfonates are particularly suitably used.

More specifically, as the sulfonates used as salts of resources for the ion of the metal having an electric potential which can reduce silver ions to metal silver in the solution and the ions of metals whose atomic numbers are 26 to 30, salts of methanesulfonic acid, ethanesulfonic acid, 2-hydroxyethanesulfonic acid, 2-propanolsulfonic acid, sulfosuccinic acid, p-phenolsulfonic acid and the like are suitably used. Of these, the salt of methanesulfonic acid is more suitably used.

The silver colloidal solution used in the present invention is preferably obtained by adding an aqueous solution of a silver compound dropwise to a solution in which the hydroxycarboxylate ion, the condensed phosphate ion and/or the amine carboxylate ion and the ion of the metal having an electric potential which can reduce silver ions to metal silver in the solution are dissolved. When metal ions selected from the ions selected from ions of metals whose atomic numbers are 26 to 30 are contained, compounds containing the metal ions may be mixed and dissolved with the ion of the metal having an electric potential which can reduce silver ions to metal silver in the solution. Alternatively, the metal ions may be added after the silver colloidal solution is produced.

As the silver compound, inorganic acid salts such as silver nitrate, silver perchlorate or silver sulfite, organic acid salts such as silver acetate or silver citrate as well as silver salt of the above organic sulfonic acids are suitably used. Of these, silver nitrate and silver organosulfonate are more suitably used, and silver organosulfonate is most suitably used.

The concentration of the hydroxycarboxylate ion, condensed phosphate ion and/or amine carboxylate ion which are/is a complexing agent for the ion of the metal having an electric potential which can reduce silver ions to metal silver in the solution, the ions which result from oxidation of the ion at the time of reduction of the silver ion and/or the ions selected from ions of metals whose atomic numbers are 26 to 30 are preferably changed according to the concentration of the above metal ions contained in the colloidal solution. The complexing agents are desirably used such that their total amount becomes at least equivalent to the total amount of the metal ions producing the silver colloid and the ions of the metals whose atomic numbers are 26 to 30. Suitable concentration thereof is preferably 1.05 to 30 times, more suitably 1.3 to 10 times, as much as the total amount of the tin ions and the metal ions in terms of gram equivalent.

As for the concentration of the metal ions selected from the ions of the metals whose atomic numbers are 26 to 30 at the time of preparing the silver colloidal solution, 0.1 to 200 g/L is suitably used, 1 to 100 g/L is more suitably used, and 1 to 50 g/L is most suitably used.

As for the concentration of the ion of the metal having an electric potential which can reduce silver ions to metal silver in the solution at the time of preparing the silver colloidal solution, 0.1 to 200 g/L is suitably used, 1 to 100 g/L is more suitably used, and 1 to 50 g/L is most suitably used.

As for the concentration of the silver ions at the time of preparing the silver colloidal solution, 0.005 to 100 g/L is suitably used, 0.01 to 50 g/L is more suitably used, and 0.05 to 20 g/L is most suitably used.

In the silver colloidal solution used in the circuit formation method of the present invention, one or more of saturated aliphatic alcohols having 10 carbon atoms or less and having only a hydroxyl group as a substituent may also be contained. More specifically, methanol, ethanol, n-propanol, i-propanol, n-butanol, i-butanol, t-butanol and the like are suitably used, for example. Methanol, ethanol and i-propanol are more suitably used.

As for the concentration of these alcohols, 1 to 500 g/L is suitably used, 1 to 300 g/L is more suitably used, and 5 to 200 g/L is most suitably used.

In the colloidal solution according to the present invention, a colloid dispersant may also be contained. The dispersant can disperse the colloid uniformly and reduce a change with time in the colloidal solution which is caused by agglomeration or the like. Further, it causes the silver colloid to be well adhered to an object to be plated and can provide excellent catalytic activity.

As the dispersant, known dispersants such as amino-acid-based compounds, glycol-ether-based compounds or glycol-ester-based compounds, cellulose or derivatives thereof, monosaccharides or polysaccharides and derivatives thereof, rubber-based compounds, surfactants and other polymer compounds can be used alone or in combination.

As examples of the amino-acid-based compounds, betaine, glycine, alanine, valine, leucine, isoleucine, lysine, serine, threonine, phenylalanine, aspartic acid, glutamic acid and the like are suitably used.

As examples of the glycol-ether-based compounds or the glycol-ester-based compounds, polyethylene glycol, polypropylene glycol, ethylene glycol monomethyl ether, ethylene glycol monoethyl ether, diethylene glycol monomethyl ether, diethylene glycol monoethyl ether, diethylene glycol dimethyl ether, triethylene glycol monomethyl ether, triethylene glycol monoethyl ether, diethylene glycol, lauryl polyethylene glycol ether, condensates of polyhydric alcohols and ethylene oxide, propylene glycol laurate and the like are suitably used.

As examples of the cellulose and derivatives thereof, cellulose, methylcellulose, carboxymethylhexylcellulose, hydroxypropylcellulose, hydroxypropylmethylcellulose, hydroxyethylcellulose, carboxymethylcellulose and the like are suitably used.

As examples of the monosaccharides or polysaccharides and derivatives thereof, cane sugar, mannitol, sorbitol, glycerol, inositol, dextrin, starch, hydroxyethyl starch, dextran, dextran sulfate, carboxymethyl dextran, heparin, ascorbic acid, polyethoxysorbitan laurate, polyethoxysorbitan oleate and the like are suitably used.

Further, rubber-based compounds such as wellan gum, xanthan gum and ramsan gum are also suitably used. In addition, water-soluble organic solvents such as tetrahydrofuran, dioxane, acetone, sulfolane, lactams, lactones and the like are also suitably used.

As the surfactant, any of nonionic, anionic, cationic and amphoteric surfactants are suitably used. Of these, polyoxyethylenated (or propylenated) sorbitan fatty ester based surfactants, polyoxyethylene alkylphenyl ether based surfactants, phosphorylated polyoxyethylene alkyl ether based surfactant, long chain sodium alkylsulfate based surfactants, halogenated alkyltrimethyl ammonium salt based surfactants and the like are suitably used.

Further, as other polymer compounds, polyvinyl pyrrolidone, polyvinylimidazole, polymers having an urea skeleton, onium and ether linkage in the backbone chain and the like are also suitably used.

The concentration of the colloid dispersant may be varied as required according to the type of the dispersant used. In general, 0.01 to 100 g/L is suitably used, and 0.01 to 50 g/L is more suitably used.

The silver colloidal solution used in the circuit formation method of the present invention may also contain a sulfur-containing compound. Illustrative examples of sulfur-containing compounds used for this purpose include thiourea, thioacetamide, ethylenethiourea, trimethylthiourea, 1-allyl-2-thiourea, thiosemicarbazide, 2-mercaptobenzothiazole, 2-mercaptobenzimidazole, 2-mercaptobenzoxazole, mercaptosuccinic acid, mercaptoacetic acid, mercaptopropionic acid, acetylcysteine, and thioglycolic acid.

The concentration of the sulfur-containing compound may be varied as required according to the type of the sulfur-containing compound used. In general, 1 mg/L to 50 g/L is suitably used, and 10 mg/L to 5 g/L is more suitably used.

The silver colloidal solution used in the circuit formation method of the present invention may also contain an antioxidant. Illustrative examples of antioxidants used for this purpose include phosphinic acid, resorcinol, pyrocatechol, hydroquinone, fluoroglycinol, pyrogallol, hydrazine, and ascorbic acid.

These antioxidants can be used alone or in admixture as required. The antioxidant is suitably used in an amount of about 0.05 to 50 g/L, more preferably about 0.1 to 10 g/L.

The silver colloidal solution used in the circuit formation method of the present invention may also contain one or more of pH buffering agents. As the pH buffering agents, known compounds can be used. More specifically, ammonium chloride, sodium, potassium and ammonium salts of phosphoric, acetic, boric and tartaric and other acids, and acid salts containing hydrogen ions in the case of polybasic acid can be mixed together and used as required. The pH buffering agent is suitably added in an amount of about 1 to 50 g/L, preferably about 1 to 20 g/L.

The silver colloidal solution so prepared can be used in the concentration as prepared in the step of giving a catalyst. Alternatively, the solution can be used after diluted with water or an aqueous solution containing components contained in the solution. A dilution rate of 20 times or less is suitably used.

The above silver colloidal solution is used and deposited as a catalyst on the surface of a non-conductor and then electroless copper plating is carried out. Any of known electroless copper plating baths is suitably used. For example, an electroless copper plating bath to be described later which uses formalin as a reducing agent is suitably used.

Before giving the catalyst to the non-conductor, the surface of the non-conductor may be conditioned in accordance with a known method so that the step can be carried out securely. For example, an aqueous solution containing 50 ml/L of commercial cleaner conditioner (trade name: NEUTRALIZER 231) of SHIPLEY FAR EAST CO., LTD. is prepared, and the board is immersed in the aqueous solution at 45° C. for 5 minutes.

After electroless copper plating is carried out, electrolytic copper plating is further carried out as required, and any of processes such as application of an etching resist, development (imaging), etching of copper and removal of the resist is carried out so as to complete a copper circuit. To carry out these processes, known methods are suitably used and there is no need to employ special step conditions. This is a great advantage that a circuit pattern can be formed inexpensively and securely by the present invention.

As the electrolytic copper plating solution, for example, a solution under standard conditions of CUBERITE TH PROCESS of EBARA-UDYLITE CO., LTD. is used, and plating of 5 to 25 μm can be carried out at 27° C. at a cathode current density of 3 A/dm$^2$.

Further, as the etching resist, a developer and a resist remover, for example, PHOTOFINER PER-200 SERIES of TAIYO INK MFG CO., LTD. can be used under standard conditions.

Further, as the copper etching solution, an etching solution described in the following (C) is adjusted to 35° C., and then the board is treated with the etching solution for a time period corresponding to the desired thickness of the copper plating, and a circuit can be formed.

As the electroless nickel or gold plating solution used when carrying out again an electroless plating such as electroless nickel plating or electroless gold plating after formation of the conductive circuit by etching, and the conditions used therefor, known plating solutions and known plating conditions are used.

When subjecting the copper circuit pattern to electroless nickel plating, deposition of electroless nickel may be started by activation of the surface of copper by acid or a palladium salt solution containing no tin may be used. The palladium salt solution containing no tin has low adhesion to the surface of a non-conductor. Although it can be used alone as a catalyst for electroless nickel plating on copper, it cannot induce deposition of good electroless copper even if it is used as a catalyst for electroless copper plating on the surface of a non-conductor.

When electroless nickel plating is carried out, for example, in a bath (E) described hereinafter at 65° C. for 15 to 30 minutes, a film thickness of 3 to 6 μm can be obtained.

Further, when electroless gold plating is carried out at 80° C. for 20 minutes by use of DAIN GOLD ST-2 of DAIWA FINE CHEMICALS CO., LTD., a film thickness of 0.1 μm can be obtained.

EXAMPLES

Hereinafter, the present invention will be further described with reference to Examples. However, the present invention shall not be limited to the following Examples and can be modified and used as required within the scope of the claim according to applications and purposes.

Example 1

An ABS resin board having throughholes as a raw material was etched in accordance with a conventional method at 75° C. for 8 minutes by use of a mixed solution comprising 300 g/L of chromic anhydride and 300 g/L of sulfuric acid and then a reduction treatment was carried out at 30° C. for 4 minutes by use of an aqueous solution comprising 50 g/L of sulfuric acid and 10 g/L of hydroxylamine sulfate. Then, the board was conditioned at 45° C. for 5 minutes by use of a solution containing 50 ml/L of the above NEUTRALIZER 231 of SHIPLEY FAR EAST CO., LTD., immersed in a silver colloidal solution shown in (A) described below for 3 minutes, rinsed with water, subjected to electroless-copper plating to a thickness of 0.5 μm by use of an electroless copper plating bath having a composition shown in (B) below, and then to copper sulfate plating to a thickness of 10 μm. After carrying out a pattern formation by an etching resist, the copper film was dissolved by an etching solution having a composition shown in (C) below. After removal of the resist, the board was immersed in a tin-free palladium chloride solution having a composition shown in (D) below and then subjected to nickel-plating by use of an electroless nickel plating solution having a composition shown in (E) below. A good electroless nickel film was deposited on the copper pattern. No electroless nickel was deposited in areas where copper was dissolved by etching.

(A) Silver Colloidal Solution

A solution containing 0.01 mol of silver nitrate in water was added dropwise to a solution containing 0.2 mol of potassium pyrophosphate and 0.1 mol of tin sulfate in water so as to prepare one liter of a silver colloidal solution. The pH of the solution was 7.1.

(B) Electroless Copper Plating Bath

| copper sulfate | 10 g/L |
|---|---|
| formalin | 12 ml/L |
| EDTA | 25 g/L |
| PEG#400 | 0.5 g/L |
| stabilizer | trace amount |
| caustic soda | 10 g/L (pH: 12.3) |

(C) Etching Solution

| sulfuric acid | 150 g/L |
|---|---|
| hydrogen peroxide solution | 160 ml/L |
| copper sulfate | 15 g/L |
| stabilizer | 4 g/L |

(D) Catalyst Solution

| palladium chloride | 0.1 g/L |
|---|---|
| hydrochloric acid | 10 ml/L |

(E) Electroless Nickel Plating Solution

| nickel sulfate | 25 g/L |
|---|---|
| sodium citrate | 75 g/L |
| lactic acid | 0 g/L |
| caustic soda | 25 g/L |
| sodium hypophosphite | 25 g/L |
| stabilizer | trace amount |

Comparative Example 1

The procedure of Example 1 was repeated except that the above silver colloidal solution (A) of Example 1 was replaced with a tin palladium catalyst solution having a composition shown in (F) described below. An electroless nickel film was deposited even on the resin surface other than the copper pattern.

(F) Tin Palladium Catalyst Solution

| palladium chloride | 0.2 g/L |
|---|---|
| tin chloride | 15 g/L |
| hydrochloric acid | 60 g/L |

Example 2

An epoxy board having no copper foil stuck thereon was immersed in the silver colloidal catalyst solution (A) under the same conditions as those in Example 1 so as to provide a catalyst, and the board was subjected to electroless copper plating (B) to a thickness of 0.5 μm, and then to panel copper sulfate plating to a thickness of 10 μm. On the thus plated board, a pattern was drawn by a plating resist, and the board was subjected to pattern copper sulfate plating to a thickness of 15 μm, and then to solder plating to a thickness of 5 μm as an etching resist. The plated resist was removed, and the copper film was etched and removed by the etching solution (C) so as to form a circuit pattern. After the solder plating (etching resist) on the circuit was dissolved and removed, electroless nickel plated film was deposited on the copper circuit to a thickness of 5 μm using the solution (E).

At this time, deposition of the electroless nickel in areas other than the circuit pattern was not observed.

Comparative Example 2

The procedure of Example 2 was repeated except that the above silver colloidal solution (A) of Example 2 was replaced with the tin palladium catalyst solution having a composition shown in (F) above as in Comparative Example 1. An electroless nickel film was deposited even on the resin surface other than the copper pattern.

Example 3

An insulating layer formed by coating an adhesive on the surface of a multilayer board including a core layer was immersed in the silver colloidal catalyst solution (A) under the same conditions as those in Example 1 so as to provide a catalyst all over the layer, and then subjected to electroless copper plating to a thickness of 1.5 μm, a circuit was drawn thereon by a resist, and then subjected to pattern copper sulfate plating to a thickness of 20 μm. Then, the plated resist was removed, and the electroless copper plated film was then dissolved by quick etching by use of the solution (C) so as to form a circuit. Thereafter, the copper surface was washed, palladium nuclei were given thereon by use of the catalyst solution (D), and the circuit was subjected to electroless nickel plating (E) to a thickness of 5 μm, and then to electroless gold plating (DAIN GOLD ST-2 of DAIWA FINE CHEMICALS CO., LTD.) to a thickness of 0.1 μm.

No deposition of nickel and gold in areas other than the copper circuit was observed, and a board having excellent insulation properties was obtained.

Example 4

In the last step of a multilayer board prepared by a build-up method on a core layer, an epoxy-resin-based photosensitive adhesive was coated on the surface, and through exposure and development, blind vias were formed. Then, after the silver colloidal catalyst was provided in the same manner as in Example 1, the board was subjected to electroless copper plating to a thickness of 7 μm, a circuit was drawn by an etching resist, and exposed copper was etched so as to form a circuit. After removal of the etching resist, it was subjected to electroless nickel plating to a thickness of 4 μm. No deposition of the nickel in areas other than the circuit was observed.

Example 5

The procedure of Example 4 was repeated except that the silver colloidal solution (A) used in Examples 1 to 4 was replaced with the silver colloidal solutions (A2) to (A6) described below. For any of the silver colloidal solutions, no deposition of electroless nickel in areas other than the circuit was observed. To observe the degree of catalytic activity, an ABS resin board having a size of 3 cm×3 cm was used, and time required for electroless copper plating to cover the whole sample was measured. The time was 6 seconds when the silver colloidal solution (A) was used, while the time was about 2 seconds when the silver colloidal solutions (A2) to (A6) were used.

(A2)

0.7 mol of sodium citrate, 0.25 mol of tin sulfate, 0.2 mol of ferrous sulfate, 10 g of isopropyl alcohol, 10 g of sodium dihydrogen phosphate and 100 mg of catechol were dissolved into 800 ml of ion exchanged water, and the pH of the resulting solution was adjusted to 4. To the solution, a solution obtained by dissolving 0.025 mol of silver nitrate in 100 ml of ion exchanged water was added dropwise, and ion exchanged water was added while the pH was adjusted to 7 so as to prepare one liter of a silver colloidal solution.

(A3)

0.5 mol of sodium citrate, 0.1 mol of tin sulfate, 0.1 mol of ferrous sulfate, 0.1 mol of nickel sulfate, 10 g of ethanol and 1 g of hydroquinone were dissolved into 800 ml of ion exchanged water, and the pH of the resulting solution was adjusted to 4. The solution was kept at 60° C., and a solution obtained by dissolving 0.01 mol of silver nitrate and 0.05 mol of sodium citrate in 100 ml of ion exchanged water was added dropwise, and ion exchanged water was added while the pH was adjusted to 7 so as to prepare one liter of a silver colloidal solution.

(A4)

0.8 mol of sodium citrate, 0.3 mol of tin methanesulfonate, 0.2 mol of ferrous sulfate, 10 g of methanol and 1 g of polyvinyl pyrrolidone were dissolved into 800 ml of ion exchanged water, and the pH of the resulting solution was adjusted to 4. To the solution, a solution obtained by dissolving 0.02 mol of silver methanesulfonate in 100 ml of ion exchanged water was added dropwise, and ion exchanged water was added while the pH was adjusted to 4 so as to prepare one liter of a silver colloidal solution.

(A5)

0.5 mol of sodium citrate, 0.2 mol of sodium gluconate, 0.2 mol of tin methanesulfonate, 0.1 mol of ferrous sulfate, 0.01 mol of zinc sulfate, 100 mg of thiourea and 5 g of polyoxyethylene alkyl phenyl ether were dissolved into 700 ml of ion exchanged water, and the pH of the resulting solution was adjusted to 4. To the solution, a solution obtained by dissolving 0.02 mol of silver methanesulfonate and 0.5 mol of sodium citrate in 200 ml of ion exchanged water was added dropwise, and ion exchanged water was added while the pH was adjusted to 4 so as to prepare one liter of a silver colloidal solution.

(A6)

0.155 mol of sodium citrate, 0.08 mol of titanium methanesulfonate, 0.07 mol of NTA, 0.1 g of catechol, 50 g of methanol and 0.1 g of polyvinyl pyrrolidone were dissolved into 700 ml of ion exchanged water, and the pH of the solution was adjusted to 1.5 by addition of methanesulfonic acid. To the solution, a solution obtained by dissolving 0.075 mol of silver methanesulfonate in 100 ml of ion exchanged water was added dropwise. Then, solution obtained by dissolving 0.08 mol of iron sulfate in 100 ml of ion exchanged water was added so as to adjust the pH to 4, thereby preparing one liter of a silver colloidal solution.

In a method of forming a circuit pattern by etching an electroless copper film by the present invention, it does not lead to the defects that the palladium nuclei used as a catalyst for electroless copper plating remain even after etching the copper film, so that insufficient insulation, a short or other defect is liable to occur in a conductive circuit, and that the electroless nickel plated film provided as the upper-layer spreads to a non-conductive layer (off-pattern deposition). As a result, the reliability of circuit pattern formation by etching becomes high, and defects in the production of build-up printed circuit boards in particular can be solved.

What is claimed is:

1. A method for forming a circuit pattern comprising at least a step (a) of subjecting a non-conductor to electroless copper plating to form a copper film and a step (b) of etching the copper film so as to form a circuit pattern, which comprises using, as a catalyst for the electroless copper plating, a silver colloidal solution comprising, as essential components, at least the following (I), (II) and (III):
    (I) silver colloidal particles,
    (II) one or more of ions of a metal having an electric potential which can reduce silver ions to metal silver in the solution or/and ions which result from oxidation of the ion at the time of reduction of the silver ions, and
    (III) one or more of hydroxycarboxylate, condensed phosphate and/or amine carboxylate ions, wherein the one or more hydroxycarboxylate ions are selected from the group consisting of glycolate, lactate, glycerate, tartronate, malate, tartarate, citrate, and gluconate,
    the silver colloidal particles (I) being produced by the ion (II) of the metal having an electric potential which can reduce silver ions to metal silver.

2. The method of claim 1, further comprising a step (c) of subjecting the circuit pattern to electroless nickel plating.

3. The method of claim 1, wherein the silver colloidal solution to be used further comprises (IV) one or more of ions selected from ions of metals whose atomic numbers are 26 to 30 (or metals whose atomic numbers are 27 to 30 when the metal (II) is iron).

4. The method of claim 1, wherein the hydroxycarboxylate ion is one or more selected from citrate, tartrate, lactate, malate, glycolate and gluconate ions.

5. The method of claim 1, wherein the condensed phosphate ion is a pyrophosphate ion.

6. The method of claim 1, wherein the amine carboxylic acid is EDTA or/and NTA.

7. The method of claim 1, wherein the metal having an electric potential which can reduce silver ions to metal silver in the solution is tin, iron or titanium.

8. The method of claim 3, wherein the metal whose atomic number is from 26 to 30 is iron.

9. The method of claim 1, wherein the silver colloidal solution further comprises one or more of ions of acids selected from the following (i) and (ii):
    (i) sulfuric acid, hydrochloric acid, nitric acid, fluoroboric acid, fluorosilicic acid, phosphoric acid and sulfamic acid, and
    (ii) an organic sulfonic acid.

10. The method of claim 8, wherein the organic sulfonic acid is one or more selected from methanesulfonic acid, 2-hydroxyethane-1-sulfonic acid, 2-hydroxypropane-1-sulfonic acid, phenolsulfonic acid, cresolsulfonic acid, trifluoromethanesulfonic acid and naphthalenesulfonic acid.

11. The method of claim 1, wherein the silver colloidal solution further contains one or more of saturated aliphatic alcohols having 10 carbon atoms or less and having a hydroxyl group only as a substituent.

12. The method of claim 1, wherein the silver colloidal solution further contains a colloid dispersant.

13. The method of claim 1, wherein the silver colloidal solution further contains a sulfur-containing compound.

14. The method of claim 1, wherein the silver colloidal solution further contains an antioxidant.

15. The method of claim 1, wherein, after forming a circuit pattern by etching the copper film, it is subjected to electroless nickel plating, without use of a palladium catalyst solution containing tin ions.

16. The method of claim 1, wherein the circuit pattern is a circuit pattern formed on a printed wiring board.

17. The method of claim 16, wherein the printed wiring board is a build-up printed wiring board, wherein circuit patterns are formed by separate application of multiple metal layers on the board.

* * * * *